(12) United States Patent
Hsu

(10) Patent No.: US 9,947,736 B2
(45) Date of Patent: Apr. 17, 2018

(54) MANUFACTURE METHOD OF AMOLED BACK PLATE AND STRUCTURE THEREOF

(71) Applicant: Shenzhen China Star Optoelectronics Technology Co., Ltd., Shenzhen, Guangdong (CN)

(72) Inventor: Yuanjun Hsu, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 15/340,948

(22) Filed: Nov. 1, 2016

(65) Prior Publication Data

US 2017/0077203 A1    Mar. 16, 2017

Related U.S. Application Data

(62) Division of application No. 14/429,082, filed on Mar. 18, 2015, now Pat. No. 9,590,020.

(30) Foreign Application Priority Data

Dec. 26, 2014    (CN) .......................... 2014 1 0837308

(51) Int. Cl.
    *H01L 27/32*    (2006.01)
    *H01L 29/45*    (2006.01)
    (Continued)

(52) U.S. Cl.
    CPC ...... *H01L 27/3262* (2013.01); *H01L 21/0262* (2013.01); *H01L 21/02532* (2013.01);
    (Continued)

(58) Field of Classification Search
    CPC ............. H01L 27/1255; H01L 27/1222; H01L 27/1274; H01L 27/3262; H01L 27/3246; H01L 27/3265; H01L 21/02532; H01L 21/02592; H01L 21/0262; H01L 21/02675; H01L 21/39604; H01L 29/41775; H01L 29/4908; H01L 29/4958; H01L 29/66757;
    (Continued)

(56) References Cited

U.S. PATENT DOCUMENTS 6,524,877 B1 *   2/2003   Nakazawa .......... H01L 27/1281
                                                       257/40
8,299,471 B2 *  10/2012   Liu .................... H01L 27/1214
                                                       257/72

(Continued)

*Primary Examiner* — Cheung Lee
*Assistant Examiner* — Stephen C Smith
(74) *Attorney, Agent, or Firm* — Andrew C. Cheng

(57) ABSTRACT

An AMOLED back plate includes a substrate on which a buffer layer and a poly-silicon section are sequentially formed. A source and a drain are respectively formed of P-type heavy doped micro silicon on the poly-silicon section that have edges facing and spaced from each other to define a channel therebetween. A gate isolation layer is formed on the buffer layer, the source, the drain and the channel. A gate is formed on the gate isolation layer and has opposite edges that face in directions toward the edges of the source and the drain. The opposite edges of the gate are spaced from the edges of the source and the drain by predetermined spacing distance in horizontal directions so as to prevent the gate from overlapping the source and the drain.

11 Claims, 5 Drawing Sheets

(51) Int. Cl.
*H01L 27/12* (2006.01)
*H01L 51/56* (2006.01)
*H01L 29/49* (2006.01)
*H01L 21/02* (2006.01)
*H01L 29/786* (2006.01)
*H01L 21/306* (2006.01)
*H01L 29/66* (2006.01)
*H01L 51/52* (2006.01)
*H01L 29/417* (2006.01)
*H01L 29/78* (2006.01)

(52) U.S. Cl.
CPC .. *H01L 21/02592* (2013.01); *H01L 21/02675* (2013.01); *H01L 21/30604* (2013.01); *H01L 27/1255* (2013.01); *H01L 27/3246* (2013.01); *H01L 27/3248* (2013.01); *H01L 27/3265* (2013.01); *H01L 29/41775* (2013.01); *H01L 29/458* (2013.01); *H01L 29/4908* (2013.01); *H01L 29/4958* (2013.01); *H01L 29/66757* (2013.01); *H01L 29/78603* (2013.01); *H01L 29/78675* (2013.01); *H01L 51/5215* (2013.01); *H01L 51/56* (2013.01); *H01L 27/1222* (2013.01); *H01L 27/1274* (2013.01); *H01L 29/7833* (2013.01); *H01L 29/78696* (2013.01); *H01L 2227/323* (2013.01); *H01L 2251/301* (2013.01); *H01L 2251/306* (2013.01); *H01L 2251/308* (2013.01)

(58) Field of Classification Search
CPC ......... H01L 29/78603; H01L 29/78675; H01L 29/7833; H01L 29/78696; H01L 51/5215; H01L 51/56; H01L 2251/301; H01L 2251/306; H01L 2251/308; H01L 2227/323
See application file for complete search history.

(56) References Cited

U.S. PATENT DOCUMENTS

| | | | | |
|---|---|---|---|---|
| 2003/0132435 | A1* | 7/2003 | Nakazawa | H01L 27/1281 257/49 |
| 2009/0194770 | A1* | 8/2009 | Liu | H01L 27/1229 257/72 |
| 2009/0206737 | A1* | 8/2009 | Liu | H01L 27/1214 313/504 |
| 2010/0055850 | A1* | 3/2010 | Chiang | G02F 1/133553 438/155 |

* cited by examiner

US 9,947,736 B2

MANUFACTURE METHOD OF AMOLED BACK PLATE AND STRUCTURE THEREOF

CROSS REFERENCE TO RELATED APPLICATIONS

This is a divisional application of co-pending U.S. patent application Ser. No. 14/429,082, filed on Mar. 18, 2015.

BACKGROUND OF THE INVENTION

1. Field of the Invention

The present invention relates to a display technology field, and more particularly to a manufacture method of an AMOLED back plate and a structure thereof.

2. The Related Arts

In the display field, liquid crystal display (LCD), organic light emitting diode (OLED) and other panel display techniques have been gradually replaced the conventional cathode ray tube (CRT) displays. The OLED possesses many outstanding properties of self-illumination, low driving voltage, high luminescence efficiency, fast response, high clarity and contrast, near 180° view angle, wide range of working temperature, applicability of flexible display and large scale full color display. The OLED is considered as the most potential flat panel display technology.

The OLED can be categorized as passive matrix OLED (PMOLED) and active matrix OLED (AMOLED) according to the driving types. Generally, the AMOLED comprises a low temperature poly-silicon (LTPS) drive back plate and an electroluminescence layer for being the self-illumination component. The low temperature poly-silicon possesses higher electron mobility. For the AMOLED, the LTPS material possesses advantages of high resolution, fast response, high brightness, high aperture ratio, low power consumption, et cetera.

A structure of an AMOLED back plate according to prior art is shown in FIG. 1. The manufacture process of the AMOLED back plate generally is:

step 1, depositing a buffer layer 200 on a glass substrate 100;

step 2, depositing an amorphous silicon layer (a-Si) on the buffer layer 200, and using the Laser process to make the amorphous silicon layer to be crystallized and converted to be a poly-silicon layer (Poly-Si);

step 3, patterning the poly-silicon layer with photo and etch processes to form a first poly-silicon section 301 and a second poly-silicon section 303;

step 4, depositing an N type heavy doped amorphous silicon layer N+a-Si on the buffer layer 200, the first poly-silicon section 301 and the second poly-silicon section 303, and implementing the photo process to define the position of a channel 400, and etching to pattern the N type heavy doped amorphous silicon layer N+a-Si for forming a source/a drain 401 on the first poly-silicon section 301 and an electrode 403 on the second poly-silicon section 303 except an area corresponding to the channel 400;

step 5, depositing and patterning the gate isolation layer 500 on the buffer layer 200, the source/the drain 401 and the electrode 403;

step 6, depositing and patterning a first metal layer on the gate isolation layer 500 to form a gate 601 and a metal electrode 603, wherein the gate 601 is above the source/the drain 401 and partially overlaps the source/the drain 401 in a horizontal direction;

step 7, sequentially forming an interlayer insulation layer 700, a metal source/a metal drain 801, a flat layer 900, an anode 1000, a pixel definition layer 1100 and a photo spacer 1200 on the gate isolation layer 500, the gate 601 and the metal electrode 603 with deposition, photo and etch processes.

The metal source/the metal drain 801 are electrically connected to the source/the drain 401; and the anode 1000 is electrically connected to the metal source/the metal drain 801.

The first poly-silicon section 301, the source/the drain 401, the gate 601 and the metal source/the metal drain 801 construct a drive TFT, and the second poly-silicon section 303, the electrode 403 and the metal electrode 603 construct a storage capacitor.

The drive TFT of the AMOLED back plate shown in FIG. 1 is an NMOS, and the AMOLED panel may suffer image sticking more easily. Besides, the contact resistance between the source/the drain 401 formed with the N type heavy doped amorphous silicon layer N+a-Si and the first poly-silicon section 301 is higher, and thus, the conductive current of the drive TFT can be lower. In addition, the source/the drain 401 and the gate 601 partially overlap each other in the horizontal direction and this may cause a leakage current of the drive TFT to be excessively high.

SUMMARY OF THE INVENTION

An objective of the present invention is to provide a manufacture method of an AMOLED back plate, which can improve the electrical property of a drive TFT to make a conductive current higher and a leakage current lower, and diminish image sticking for raising the display quality of the AMOLED.

Another objective of the present invention is to provide an AMOLED back plate, which can improve the electrical property of the drive TFT to make a conductive current higher and a leakage current lower, and diminish image sticking for raising the display quality of the AMOLED.

For realizing the aforesaid objectives, the present invention provides a manufacture method of an AMOLED back plate, which comprises sequentially depositing a buffer layer, an amorphous silicon layer on a substrate, and crystallizing and converting the amorphous silicon layer to be a poly-silicon layer, and patterning the poly-silicon layer, and then deposing a P type heavy doped micro silicon layer, and implementing a photo process to define a position of a channel, and etching the P type heavy doped micro silicon layer to form a source/a drain, and thereafter, sequentially forming a gate isolation layer, a gate, an interlayer insulation layer, a metal source/a metal drain, a flat layer, an anode, a pixel definition layer and a photo spacer; the source/the drain and the gate do not overlap in the horizontal direction and are mutually spaced.

The manufacture method of the AMOLED back plate comprises the following steps:

step 1, providing a substrate and deposing a buffer layer on the substrate;

step 2, depositing an amorphous silicon layer on the buffer layer and implementing an excimer laser annealing process to the amorphous silicon layer to make the amorphous silicon layer crystallized and converted into a poly-silicon layer;

step 3, patterning the poly-silicon layer with photo and etch processes to form a first poly-silicon section and a second poly-silicon section;

step 4, deposing a P type heavy doped micro silicon layer on the buffer layer, the first poly-silicon section and the second poly-silicon section; implementing a photo process to define a position of a channel; and etching the P type heavy doped micro silicon layer to pattern the P type heavy doped micro silicon layer for forming a source/a drain on the first poly-silicon section and an electrode on the second poly-silicon section except an area corresponding to the channel;

step 5, deposing and patterning a gate isolation layer on the buffer layer, the source/the drain and the electrode;

step 6, deposing and patterning a first metal layer on the gate isolation layer to form a gate and a metal electrode;

wherein the gate is above the channel and the source/the drain and the gate are mutually spaced with a certain distance in a horizontal direction;

step 7, sequentially forming an interlayer insulation layer, a metal source/a metal drain, a flat layer, an anode, a pixel definition layer, and a photo spacer on the gate isolation layer, the gate and the metal electrode with deposition, photo and etch processes;

wherein the metal source/the metal drain are electrically connected to the source/the drain; and the anode is electrically connected to the metal source/the metal drain; and wherein the first poly-silicon section, the source/the drain, the gate and the metal source/the metal drain construct a drive TFT, and the second poly-silicon section, the electrode and the metal electrode construct a storage capacitor.

In the step 4, the P type heavy doped micro silicon layer is deposed by chemical vapor deposition (CVD).

The mutually spaced distance of the source/the drain and the gate in the horizontal direction is 0.1-0.5 µm.

A material of the gate is a stacked combination of one or more of molybdenum, titanium, aluminum and copper.

A material of the buffer layer is silicon nitride, silicon oxide, or a combination thereof; and a material of the interlayer insulation layer is silicon oxide, silicon nitride or a combination thereof.

A material of the anode is an indium tin oxide/silver/indium tin oxide compound thin film.

The present invention further provides a structure of an AMOLED back plate, comprising a substrate, a buffer layer located on the substrate, a first poly-silicon section and a second poly-silicon section arranged in space on the buffer layer, a source/a drain and an electrode respectively located on the first poly-silicon section and the second poly-silicon section, a gate isolation layer located on the buffer layer, the source/the drain and the electrode, a gate and a metal electrode located on the gate isolation layer, and an interlayer insulation layer, a metal source/a metal drain, a flat layer, an anode, a pixel definition layer and a photo spacer, sequentially formed on the gate isolation layer, the gate and the metal electrode, wherein the metal source/the metal drain are electrically connected to the source/the drain and the anode is electrically connected to the metal source/the metal drain;

wherein a material of the source/the drain is P type heavy doped micro silicon; a channel is located between the source/the drain; and the gate is above the channel and the source/the drain and the gate are mutually spaced in a horizontal direction;

wherein the first poly-silicon section, the source/the drain, the gate and the metal source/the metal drain construct a drive TFT, and the second poly-silicon section, the electrode and the metal electrode construct a storage capacitor.

The mutually spaced distance of the source/the drain and the gate in the horizontal direction is 0.1-0.5 µm.

A material of the gate is a stacked combination of one or more of molybdenum, titanium, aluminum and copper; a material of the buffer layer is silicon nitride, silicon oxide, or a combination thereof; a material of the interlayer insulation layer is silicon oxide, silicon nitride or a combination thereof; and a material of the anode is an indium tin oxide/silver/indium tin oxide compound thin film.

The present invention further provides a structure of an AMOLED back plate, comprising a substrate, a buffer layer located on the substrate, a first poly-silicon section and a second poly-silicon section arranged in space on the buffer layer, a source/a drain and an electrode respectively located on the first poly-silicon section and the second poly-silicon section, a gate isolation layer located on the buffer layer, the source/the drain and the electrode, a gate and a metal electrode located on the gate isolation layer, and an interlayer insulation layer, a metal source/a metal drain, a flat layer, an anode, a pixel definition layer and a photo spacer, sequentially formed on the gate isolation layer, the gate and the metal electrode, wherein the metal source/the metal drain are electrically connected to the source/the drain and the anode is electrically connected to the metal source/the metal drain;

wherein a material of the source/the drain is P type heavy doped micro silicon; a channel is located between the source/the drain; the gate is above the channel, and the source/the drain and the gate are mutually spaced in a horizontal direction;

wherein the first poly-silicon section, the source/the drain, the gate and the metal source/the metal drain construct a drive TFT, and the second poly-silicon section, the electrode and the metal electrode construct a storage capacitor;

wherein the mutually spaced distance of the source/the drain and the gate in the horizontal direction is 0.1-0.5 µm;

wherein a material of the gate is a stacked combination of one or more of molybdenum, titanium, aluminum and copper; a material of the buffer layer is silicon nitride, silicon oxide, or a combination thereof; a material of the interlayer insulation layer is silicon oxide, silicon nitride or a combination thereof; and a material of the anode is an indium tin oxide/silver/indium tin oxide compound thin film.

The benefits of the present invention are as follows. The present invention provides a manufacture method of an AMOLED back plate, in which by deposing and patterning a P type heavy doped micro silicon layer to form a source/a drain, and making the source/the drain and a gate be mutually spaced in a horizontal direction, the contact resistance between the source/the drain and a first poly-silicon section can be reduced to improve the electrical property of a drive TFT to make a conductive current higher and a leakage current lower, and diminish image sticking for raising the display quality of the AMOLED. The present invention also provides a structure of an AMOLED back plate, in which by locating a source/a drain of which a material is P type heavy doped micro silicon such that the source/the drain and a gate are mutually spaced in a horizontal direction, the contact resistance between the source/the drain and a first poly-silicon section can be reduced to improve the electrical property of a drive TFT to make a conductive current higher and a leakage current lower, and diminish image sticking for raising the display quality of the AMOLED.

BRIEF DESCRIPTION OF THE DRAWINGS

The technical solution and the beneficial effects of the present invention are best understood from the following detailed description with reference to the accompanying figures and embodiments.

In the drawings.

DETAILED DESCRIPTION OF THE PREFERRED EMBODIMENTS

For better explaining the technical solution and the effect of the present invention, the present invention will be further described in detail with the accompanying drawings and the specific embodiments.

Referring to FIGS. 2-7, the present invention provides a manufacture method of an AMOLED back plate, comprising the following steps:

step 1, providing a substrate 1 and deposing a buffer layer 2 on the substrate 1.

The substrate 1 is a transparent substrate. Preferably, the substrate 1 is a glass substrate or a plastic substrate.

Figure 1:
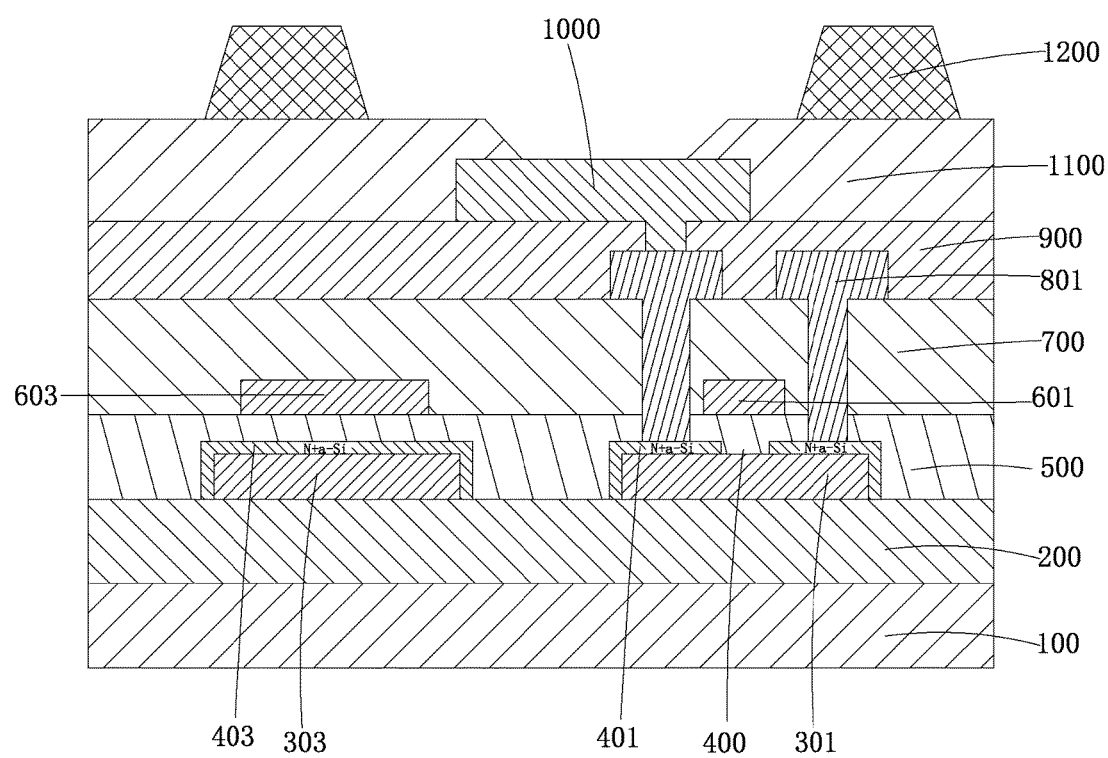
FIG. 1 is a diagram of an AMOLED back plate structure according to prior art.
Figure 2:
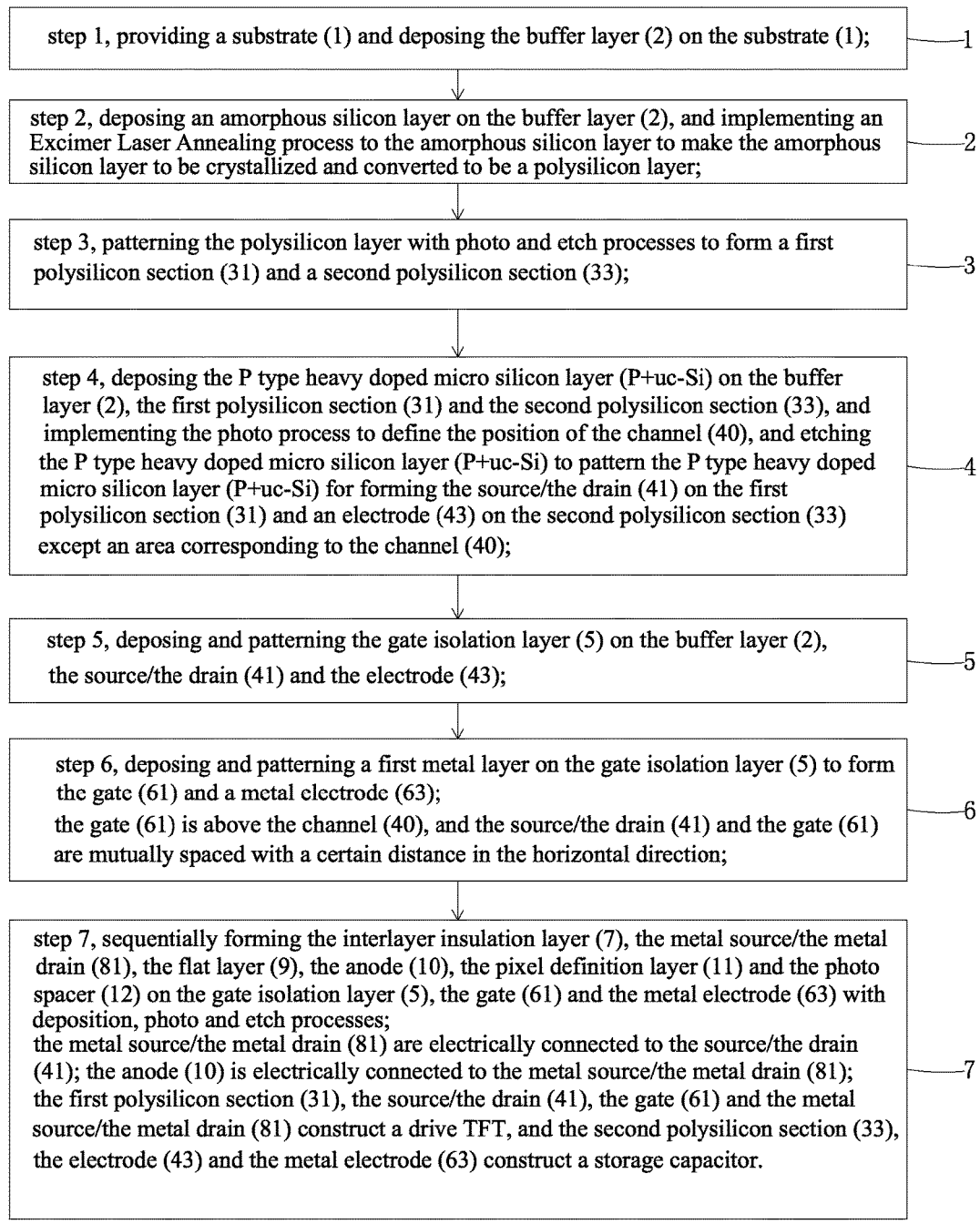
FIG. 2 is a flowchart of a manufacture method of an AMOLED back plate according to the present invention.
Figure 3:
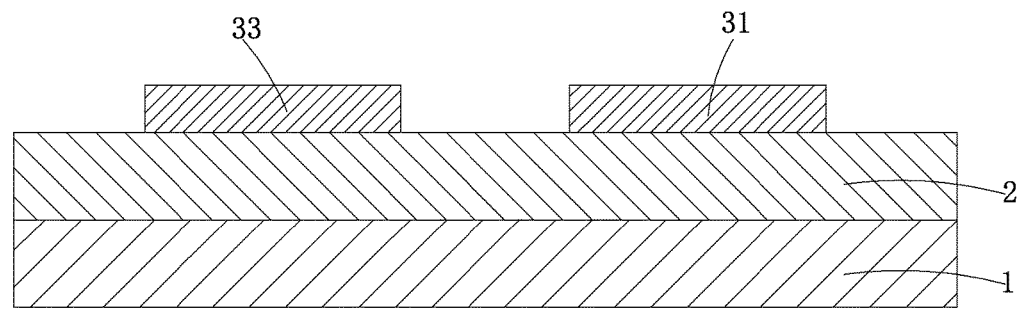
FIG. 3 is a diagram of step 3 in the manufacture method of the AMOLED back plate according to the present invention.
Figure 4:
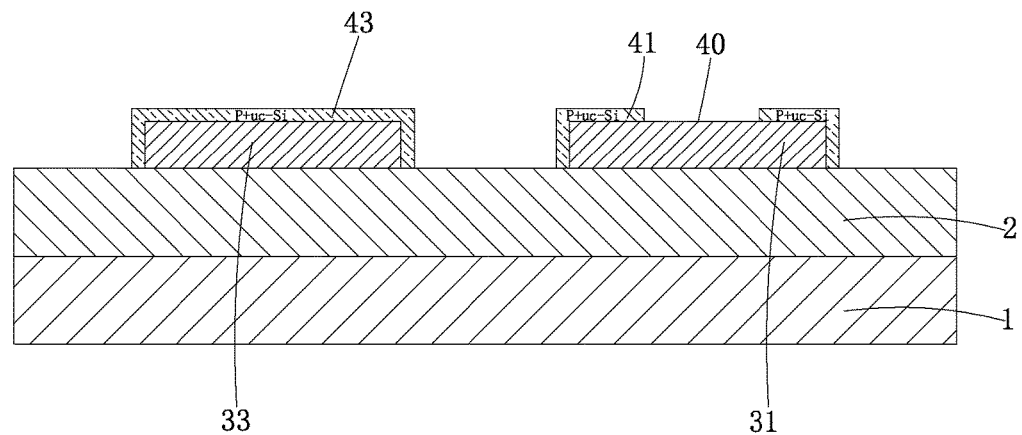
FIG. 4 is a diagram of step 4 in the manufacture method of the AMOLED back plate according to the present invention.
Figure 5:
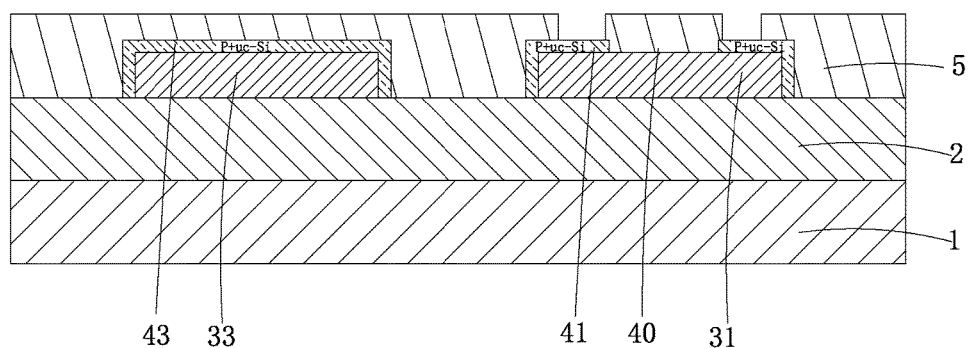
FIG. 5 is a diagram of step 5 in the manufacture method of the AMOLED back plate according to the present invention.
Figure 6:
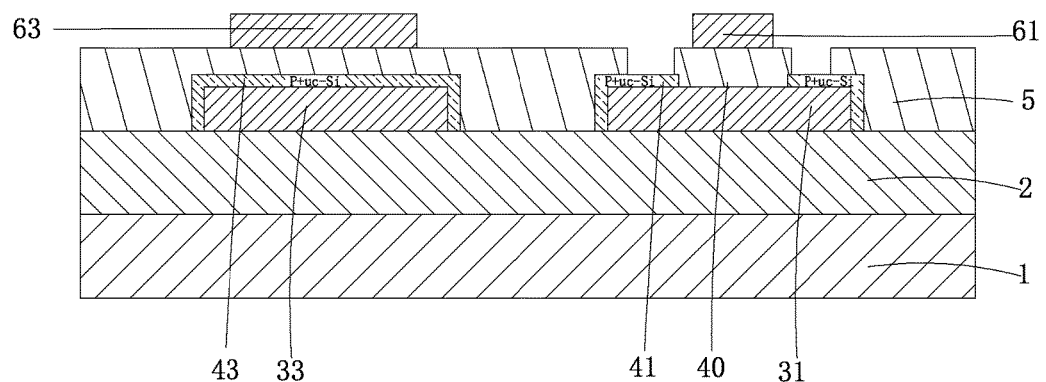
FIG. 6 is a diagram of step 6 in the manufacture method of the AMOLED back plate according to the present invention.

A material of the buffer layer 2 is silicon nitride (SiNx), silicon oxide (SiOx), or a combination thereof.

step 2, deposing an amorphous silicon layer on the buffer layer 2, and implementing an excimer laser annealing process to the amorphous silicon layer to make the amorphous silicon layer crystallized and converted into a poly-silicon layer.

step 3, as shown in FIG. 3, patterning the poly-silicon layer with photo and etch processes to form a first poly-silicon section 31 and a second poly-silicon section 33.

step 4, as shown in FIG. 4, deposing a P type heavy doped micro silicon (P+micro-crystallized Si) layer P+uc-Si on the buffer layer 2, the first poly-silicon section 31 and the second poly-silicon section 33 by chemical vapor deposition (CVD); implementing a photo process to define a position of a channel 40; and etching the P type heavy doped micro silicon layer P+uc-Si to pattern the P type heavy doped micro silicon layer P+uc-Si for forming a source/a drain 41 on the first poly-silicon section 31 and an electrode 43 on the second poly-silicon section 33 except an area corresponding to the channel 40.

step 5, as shown in FIG. 5, deposing and patterning a gate isolation layer 5 on the buffer layer 2, the source/the drain 41 and the electrode 43.

step 6, as shown in FIG. 6, deposing and patterning a first metal layer on the gate isolation layer 5 to form a gate 61 and a metal electrode 63.

The gate 61 is located above the channel 40, and the source/the drain 41 and the gate 61 are mutually spaced with a certain distance in a horizontal direction. Furthermore, the mutually spaced distance of the source/the drain 41 and the gate 61 in the horizontal direction is 0.1-0.5 μm.

Figure 7:
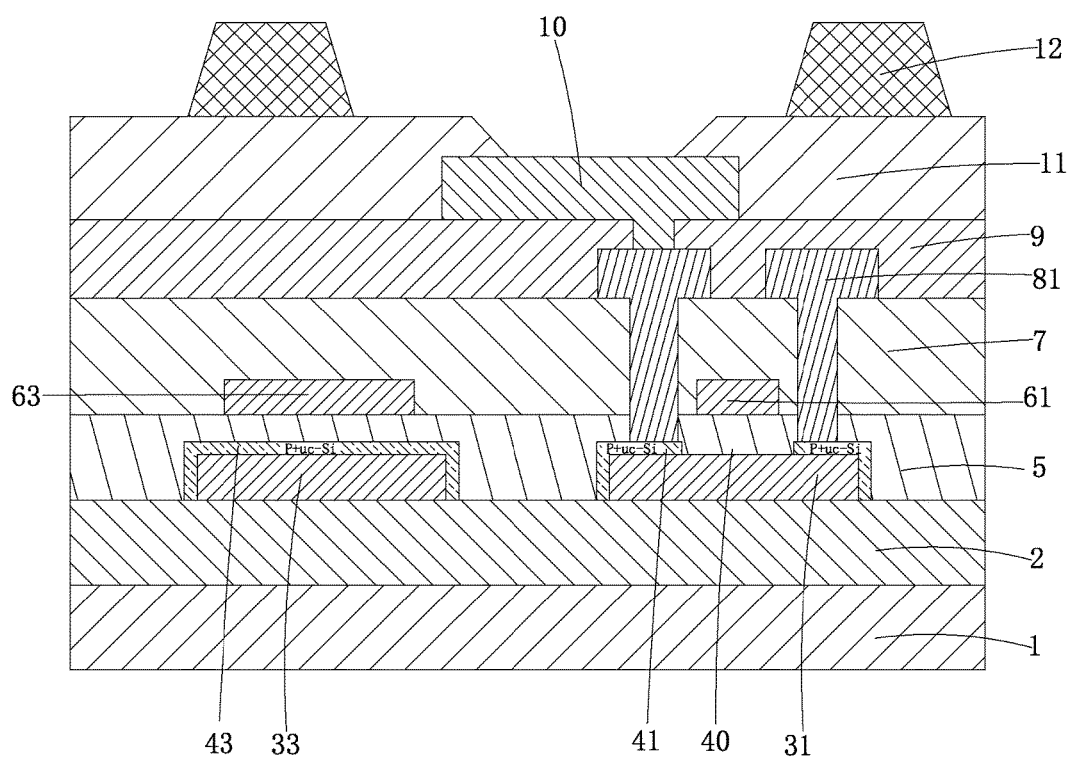
FIG. 7 is a diagram of step 7 in the manufacture method of the AMOLED back plate and a diagram of a structure of the AMOLED back plate according to the present invention.

A material of the gate 61 and the metal electrode 63 is a stacked combination of one or more of molybdenum (Mo), titanium (Ti), aluminum (Al) and copper (Cu).

step 7, as shown in FIG. 7, sequentially forming an interlayer insulation layer 7, a metal source/a metal drain 81, a flat layer 9, an anode 10, a pixel definition layer 11, and a photo spacer 12 on the gate isolation layer 5, the gate 61 and the metal electrode 63 with deposition, photo and etch processes.

The metal source/the metal drain 81 are electrically connected to the source/the drain 41; and the anode 10 is electrically connected to the metal source/the metal drain 81.

A material of the interlayer insulation layer 7 is silicon oxide, silicon nitride or a combination thereof. A material of the anode 10 is an indium tin oxide/silver/indium tin oxide (ITO/Ag/ITO) compound thin film.

The first poly-silicon section 31, the source/the drain 41, the gate 61 and the metal source/the metal drain 81 construct a drive TFT, and the second poly-silicon section 33, the electrode 43 and the metal electrode 63 construct a storage capacitor.

In the aforesaid manufacture method of the AMOLED back plate, the source/the drain 41 is obtained by deposing and patterning a P type heavy doped micro silicon layer P+uc-Si, and thus, the drive TFT is a P type TFT, and the AMOLED driven by the P type TFT can diminish image sticking to thus improve the display quality of the AMOLED. Further, the material property of the P type heavy doped micro silicon is more similar with that of the poly-silicon, and thus, the contact resistance between the source/the drain 41 and the first poly-silicon section 31 can be reduced to improve the electrical property of the drive TFT to make a conductive current higher. The source/the drain 41 and the gate 61 are mutually spaced in the horizontal direction with no overlapping area therebetween so as to make a leakage current of the drive TFT lower.

Referring to FIG. 7, the present invention also provides a structure of an AMOLED back plate, which comprises a substrate 1, a buffer layer 2 located on the substrate 1, a first poly-silicon section 31 and a second poly-silicon section 33 arranged in space on the buffer layer 2, a source/a drain 41 and an electrode 43 respectively located on the first poly-silicon section 31 and the second poly-silicon section 33, a gate isolation layer 5 located on the buffer layer 2, the source/the drain 41 and the electrode 43, a gate 61 and a metal electrode 63 located on the gate isolation layer 5, and an interlayer insulation layer 7, a metal source/a metal drain 81, a flat layer 9, an anode 10, a pixel definition layer 11 and a photo spacer 12 sequentially formed on the gate isolation layer 5, the gate 61 and the metal electrode 63.

The metal source/the metal drain 81 are electrically connected to the source/the drain 41. The anode 10 is electrically connected to the metal source/the metal drain 81. The first poly-silicon section 31, the source/the drain 41, the gate 61 and the metal source/the metal drain 81 construct a drive TFT, and the second poly-silicon section 33, the electrode 43 and the metal electrode 63 construct a storage capacitor.

A material of the source/the drain 41 is P type heavy doped micro silicon (P+uc-Si). A channel 40 is located between the source/the drain 41. The gate 61 is located above the channel 40. The source/the drain 41 and the gate 61 do not overlap each other and are mutually spaced in a horizontal direction. Furthermore, the mutually spaced distance between the source/the drain 41 and the gate 61 in the horizontal direction is 0.1-0.5 μm.

Specifically, the substrate 1 is a transparent substrate. Preferably, the substrate 1 is a glass substrate or a plastic substrate. A material of the gate 61 is a stacked combination of one or more of molybdenum, titanium, aluminum and copper. A material of the buffer layer 2 is silicon nitride, silicon oxide, or a combination thereof. A material of the interlayer insulation layer 7 is silicon oxide, silicon nitride or a combination thereof. A material of the anode 10 is an indium tin oxide/silver/indium tin oxide compound thin film.

In the aforesaid structure of AMOLED back plate, the material of the source/the drain 41 is P type heavy doped micro silicon P+uc-Si, and thus, the drive TFT is a P type TFT, and the AMOLED driven by the P type TFT can diminish image sticking and thus improving the display quality of the AMOLED. Further, the material property of the P type heavy doped micro silicon is more similar with that of the poly-silicon, and thus, the contact resistance between the source/the drain 41 and the first poly-silicon section 31 can be reduced to improve the electrical property of the drive TFT to make a conductive current higher. The source/the drain 41 and the gate 61 are mutually spaced in the horizontal direction with no overlapping area therebetween so as to make a leakage current of the drive TFT lower.

In conclusion, in the manufacture method of an AMOLED back plate of the present invention, by deposing and patterning a P type heavy doped micro silicon layer to form a source/a drain and making the source/the drain and a gate be mutually spaced in a horizontal direction, the contact resistance between the source/the drain and a first poly-silicon section can be reduced to improve the electrical property of the drive TFT to make a conductive current higher and a leakage current lower, and diminish image sticking for raising the display quality of the AMOLED. In a structure of an AMOLED back plate of the present invention, by locating a source/a drain of which a material is P type heavy doped micro silicon such that the source/the drain and a gate are mutually spaced from each other in a horizontal direction, the contact resistance between the source/the drain and a first poly-silicon section can be reduced to improve the electrical property of the drive TFT to make a conductive current higher and a leakage current lower, and diminish image sticking for raising the display quality of the AMOLED.

The above provides only specific embodiments of the present invention, and the scope of the present invention is not limited to it. To those skilled in the art, modification or substitution that are easily derived should be covered by the protection scope sought for the invention. Thus, the scope of the invention should be defined by the appended claims.

What is claimed is:

1. An active matrix organic light emitting diode (AMOLED) back plate, comprising:
    a substrate;
    a buffer layer located on the substrate;
    a first poly-silicon section and a second poly-silicon section each comprising a block of poly-silicon, wherein the blocks of poly-silicon of the first and second poly-silicon sections are arranged on the buffer layer and spaced from each other and each of the block of poly-silicon has a top surface that is opposite to and distance from the buffer layer;
    a source and a drain formed on the block of poly-silicon of the first poly-silicon section and a lower electrode formed on the block of poly-silicon of the second poly-silicon section;
    a gate isolation layer located on the buffer layer, the source/the drain and the lower electrode;
    a gate and a metal electrode formed on the gate isolation layer; and
    an interlayer insulation layer, a metal source and a metal drain, a flat layer, an anode, a pixel definition layer, and a photo spacer, which are sequentially formed on the gate isolation layer, the gate and the metal electrode such that the metal source and the metal drain are electrically connected to the source and the drain and the anode is electrically connected to one of the metal source and the metal drain;
    wherein the source and the drain are formed of a material comprising P type heavy doped micro silicon, such that a first portion of the P type heavy doped micro silicon that is located on the top surface of the block of poly-silicon of the first poly-silicon section and forms the source and a second portion of the P type heavy doped micro silicon that is located on the top surface of the block of poly-silicon of the first poly-silicon section and forms drain respectively have a first edge and a second edge, which are located on the top surface of the block of poly-silicon of the first poly-silicon section and face each other and are spaced from each other by a spacing distance in which a channel is formed and located between the source and the drain; and the gate that is formed on the gate isolation layer is located above the channel such that the gate has opposite side edges respectively facing in directions toward the first edge of the first portion of the P type heavy doped micro silicon and the second edge of the second portion of the P type heavy doped micro silicon and the opposite side edges of the gate are respectively spaced, in horizontal directions, from the first and second edges of the first and second portions of the P type heavy doped micro silicon by predetermined spacing distances to prevent the gate from overlapping the source and the drain; and
    wherein the first poly-silicon section, the source and the drain, the gate, and the metal source and the metal drain construct a drive TFT, wherein the metal source and the metal drain are respectively located above and corresponding in position to the first and second portions of the P type heavy doped micro silicon that are located on the top surface of the block of poly-silicon of the first poly-silicon section, and the second poly-silicon section, the lower electrode, and the metal electrode construct a storage capacitor, wherein the lower electrode has a portion located on the top surface of the block of poly-silicon of the second poly-silicon section and opposite to and space from the metal electrode, a combination of the block of poly-silicon of the second poly-silicon section and the lower electrode being opposite to and spaced from the metal electrode by a portion of the gate isolation layer to respectively serve as two electrodes of the storage capacitor.

2. The AMOLED back plate as claimed in claim 1, wherein the predetermined spacing distances between the opposite edges of the gate and the first and second edges of the first and second portions of the P type heavy doped micro silicon are each within a range of 0.1-0.5 μm.

3. The AMOLED back plate as claimed in claim 1, wherein the gate is formed of a material that comprises a stacked combination of one or more of molybdenum, titanium, aluminum and copper.

4. The AMOLED back plate as claimed in claim 1, wherein the buffer layer is formed of a material comprising one of silicon nitride and silicon oxide, or a combination thereof.

5. The AMOLED back plate as claimed in claim 1, wherein the interlayer insulation layer is formed of a material comprising one of silicon oxide and silicon nitride or a combination thereof.

6. The AMOLED back plate as claimed in claim 1, wherein the anode comprises an indium tin oxide/silver/indium tin oxide compound film.

7. An active matrix organic light emitting diode (AMOLED) back plate, comprising:
a substrate;
a buffer layer located on the substrate;
a first poly-silicon section and a second poly-silicon section each comprising a block of poly-silicon, wherein the blocks of poly-silicon of the first and second poly-silicon sections are arranged on the buffer layer and spaced from each other and each of the block of poly-silicon has a top surface that is opposite to and distance from the buffer layer;
a source and a drain formed on the block of poly-silicon of the first poly-silicon section and a lower electrode formed on the block of poly-silicon of the second poly-silicon section;
a gate isolation layer located on the buffer layer, the source/the drain and the lower electrode;
a gate and a metal electrode formed on the gate isolation layer; and
an interlayer insulation layer, a metal source and a metal drain, a flat layer, an anode, a pixel definition layer, and a photo spacer, which are sequentially formed on the gate isolation layer, the gate and the metal electrode such that the metal source and the metal drain are electrically connected to the source and the drain and the anode is electrically connected to one of the metal source and the metal drain;
wherein the source and the drain are formed of a material comprising P type heavy doped micro silicon, such that a first portion of the P type heavy doped micro silicon that is located on the top surface of the block of poly-silicon of the first poly-silicon section and forms the source and a second portion of the P type heavy doped micro silicon that is located on the top surface of the block of poly-silicon of the first poly-silicon section and forms drain respectively have a first edge and a second edge, which are located on the top surface of the block of poly-silicon of the first poly-silicon section and face each other and are spaced from each other by a spacing distance in which a channel is formed and located between the source and the drain; and the gate that is formed on the gate isolation layer is located above the channel such that the gate has opposite side edges respectively facing in directions toward the first edge of the first portion of the P type heavy doped micro silicon and the second edge of the second portion of the P type heavy doped micro silicon and the opposite side edges of the gate are respectively spaced, in horizontal directions, from the first and second edges of the first and second portions of the P type heavy doped micro silicon by predetermined spacing distances to prevent the gate from overlapping the source and the drain;
wherein the first poly-silicon section, the source and the drain, the gate, and the metal source and the metal drain construct a drive TFT, wherein the metal source and the metal drain are respectively located above and corresponding in position to the first and second portions of the P type heavy doped micro silicon that are located on the top surface of the block of poly-silicon of the first poly-silicon section, and the second poly-silicon section, the lower electrode, and the metal electrode construct a storage capacitor, wherein the lower electrode has a portion located on the top surface of the block of poly-silicon of the second poly-silicon section and opposite to and space from the metal electrode, a combination of the block of poly-silicon of the second poly-silicon section and the lower electrode being opposite to and spaced from the metal electrode by a portion of the gate isolation layer to respectively serve as two electrodes of the storage capacitor; and
wherein the predetermined spacing distances between the opposite edges of the gate and the first and second edges of the first and second portions of the P type heavy doped micro silicon are each within a range of 0.1-0.5 µm.

8. The AMOLED back plate as claimed in claim 7, wherein the gate is formed of a material that comprises a stacked combination of one or more of molybdenum, titanium, aluminum and copper.

9. The AMOLED back plate as claimed in claim 7, wherein the buffer layer is formed of a material comprising one of silicon nitride and silicon oxide, or a combination thereof.

10. The AMOLED back plate as claimed in claim 7, wherein the interlayer insulation layer is formed of a material comprising one of silicon oxide and silicon nitride or a combination thereof.

11. The AMOLED back plate as claimed in claim 7, wherein the anode comprises an indium tin oxide/silver/indium tin oxide compound film.

* * * * *